(12) United States Patent
Mulfinger et al.

(10) Patent No.: US 10,756,184 B2
(45) Date of Patent: Aug. 25, 2020

(54) FACETED EPITAXIAL SOURCE/DRAIN REGIONS

(71) Applicant: GLOBALFOUNDRIES INC., Grand Cayman (KY)

(72) Inventors: George R. Mulfinger, Gansevoort, NY (US); Timothy J. McArdle, Albuquerque, NM (US); Judson R. Holt, Ballston Lake, NY (US); Steffen A. Sichler, Radebeul (DE); Ömür I. Aydin, Dresden (DE); Wei Hong, Clifton Park, NY (US); Yi Qi, Niskayuna, NY (US); Hui Zang, Guilderland, NY (US); Liu Jiang, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/180,486

(22) Filed: Nov. 5, 2018

(65) Prior Publication Data

US 2020/0144365 A1 May 7, 2020

(51) Int. Cl.
| | |
|---|---|
| *H01L 29/08* | (2006.01) |
| *H01L 21/8238* | (2006.01) |
| *H01L 29/06* | (2006.01) |
| *H01L 29/423* | (2006.01) |
| *H01L 21/28* | (2006.01) |

(52) U.S. Cl.
CPC .... *H01L 29/0847* (2013.01); *H01L 21/28141* (2013.01); *H01L 21/823807* (2013.01); *H01L 21/823814* (2013.01); *H01L 21/823864* (2013.01); *H01L 29/0653* (2013.01); *H01L 29/42364* (2013.01)

(58) Field of Classification Search
CPC ............ H01L 29/0847; H01L 29/0653; H01L 29/42364; H01L 21/823807; H01L 21/823864; H01L 21/823814; H01L 21/28141
USPC ............... 257/286, 288, 347, 360, 369, 374, 257/E21.013, E21.019, E21.158, E21.19, 257/E21.251, E21.275, E21.438, E21.622, 257/E21.626, E21.632, E27.06, E27.062, 257/E29.054, E29.063, E29.156, E29.266; 438/154, 301, 303, 305, 586
See application file for complete search history.

(56) References Cited

U.S. PATENT DOCUMENTS

| | | | |
|---|---|---|---|
| 7,405,131 B2 | 7/2008 | Chong et al. | |
| 7,759,206 B2 | 7/2010 | Luo et al. | |
| 8,329,549 B2 * | 12/2012 | Beyer | ............... H01L 21/28123 257/E21.409 |
| 9,472,642 B2 | 10/2016 | Hoentschel et al. | |
| 9,793,294 B1 * | 10/2017 | Thees | ............... H01L 29/0642 |
| 9,806,170 B1 * | 10/2017 | Mulfinger | ........... H01L 29/6656 |
| 10,008,576 B2 | 6/2018 | Mulfinger et al. | |

(Continued)

*Primary Examiner* — Dao H Nguyen
(74) *Attorney, Agent, or Firm* — Yee Tze Lim; Andrew M. Calderon; Roberts Calderon Safran & Cole P.C.

(57) ABSTRACT

The present disclosure relates to semiconductor structures and, more particularly, to faceted epitaxial source/drain regions and methods of manufacture. The structure includes: a gate structure over a substrate; an L-shaped sidewall spacer located on sidewalls of the gate structure and extending over the substrate adjacent to the gate structure; and faceted diffusion regions on the substrate, adjacent to the L-shaped sidewall spacer.

17 Claims, 4 Drawing Sheets

(56) References Cited

U.S. PATENT DOCUMENTS

| | | | |
|---|---|---|---|
| 2002/0190284 A1* | 12/2002 | Murthy | H01L 21/28052 |
| | | | 257/286 |
| 2005/0037585 A1* | 2/2005 | Park | H01L 29/4983 |
| | | | 438/305 |
| 2005/0051851 A1* | 3/2005 | Chen | H01L 21/823807 |
| | | | 257/369 |
| 2006/0121681 A1 | 6/2006 | Nandakumar | |
| 2007/0235802 A1 | 10/2007 | Chong et al. | |
| 2011/0254090 A1* | 10/2011 | Cheng | H01L 29/66772 |
| | | | 257/347 |
| 2012/0153398 A1* | 6/2012 | Baars | H01L 21/823412 |
| | | | 257/369 |
| 2012/0241868 A1* | 9/2012 | Tsai | H01L 21/823807 |
| | | | 257/369 |
| 2013/0320449 A1 | 12/2013 | Hoentschel et al. | |
| 2013/0320450 A1 | 12/2013 | Hoentschel et al. | |
| 2015/0263122 A1* | 9/2015 | Hsiao | H01L 29/515 |
| | | | 257/401 |
| 2016/0056261 A1* | 2/2016 | Thees | H01L 29/6656 |
| | | | 257/288 |
| 2017/0170291 A1 | 6/2017 | Mulfnger et al. | |
| 2017/0330953 A1* | 11/2017 | Mulfinger | H01L 29/6656 |
| 2018/0337280 A1* | 11/2018 | Zhao | H01L 21/02381 |

* cited by examiner

FACETED EPITAXIAL SOURCE/DRAIN REGIONS

FIELD OF THE INVENTION

The present disclosure relates to semiconductor structures and, more particularly, to faceted epitaxial source/drain regions and methods of manufacture.

BACKGROUND

When faceting PFET epi by epi recipe, variability is challenging. Achieving a consistent facet requires an unrealistic (e.g., not manufacturable) balance of boron concentration and deposition pressure, which varies drastically across pitch, density and epi tools. Also, with existing spacer formation processes, faceting is inconsistent and extremely variable within wafer, wafer-to-wafer, lot-to-lot and across epi-tools. Accordingly it is very difficult to achieve performance consistency from chip to chip within a single wafer, wafer-to-wafer or lot-to-lot.

SUMMARY

In an aspect of the disclosure, a structure comprises: a gate structure located on a substrate; an L-shaped sidewall spacer located on sidewalls of the gate structure and extending over the substrate adjacent to the gate structure; and faceted diffusion regions on the substrate, adjacent to the L-shaped sidewall spacer.

In an aspect of the disclosure, a structure comprising: a semiconductor on insulator substrate; a gate structure formed on the semiconductor on insulator substrate; an L-shaped sidewall spacer on a sidewall of the gate structure and extending onto the semiconductor on insulator substrate; and faceted raised epitaxial grown source and drain regions adjacent to a leg of the L-shaped sidewall spacer extending onto the semiconductor on insulator substrate.

In an aspect of the disclosure, a method comprises: forming a gate structure on a substrate; forming at least a bi-layer spacer stack composed of a sacrificial layer of material; removing at least a portion of the sacrificial layer to form an L-shaped sidewall spacer on the gate structure; and forming a raised source/drain region on the substrate adjacent to the L-shaped sidewall spacer.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to faceted epitaxial source/drain regions and methods of manufacture. More specifically, the present disclosure relates to faceted epitaxial source/drain regions for fully depleted semiconductor e.g., silicon, on insulator (FDSOI) technologies. Advantageously, the present disclosure provides gate-to-source/drain capacitance (Cov) reduction from faceted epitaxial without variability or manufacturability challenges.

In embodiments, the faceted epitaxial source/drain regions are PFET faceted epitaxial regions; although the faceted epitaxial source/drain regions can also be NFET faceted epitaxial regions. In embodiments, the faceted epitaxial source/drain regions are formed using an L-shaped spacer technique. More specifically, the L-shaped spacer will force a faceting of the epitaxial material, adjacent to the gate structure. Advantageously, the L-shaped spacer provides a consistent facet, compared to conventionally formed epitaxial source/drain regions, e.g., facet-by-epi. The L-spacer will also reduce Cov and Cov variability. Yield will also be improved using the L-spacer technique described herein.

The faceted epitaxial source/drain regions of the present disclosure can be manufactured in a number of ways using a number of different tools. In general, though, the methodologies and tools are used to form structures with dimensions in the micrometer and nanometer scale. The methodologies, i.e., technologies, employed to manufacture the faceted epitaxial source/drain regions of the present disclosure have been adopted from integrated circuit (IC) technology. For example, the structures are built on wafers and are realized in films of material patterned by photolithographic processes on the top of a wafer. In particular, the fabrication of the faceted epitaxial source/drain regions uses three basic building blocks: (i) deposition of thin films of material on a substrate, (ii) applying a patterned mask on top of the films by photolithographic imaging, and (iii) etching the films selectively to the mask.

Figure 1:
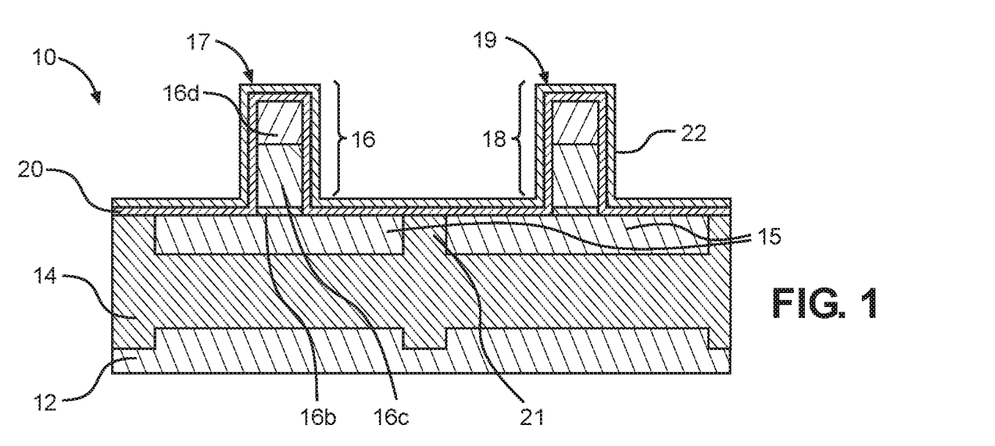
FIG. 1 shows gate structures, amongst other features, and respective fabrication processes in accordance with aspects of the present disclosure.

FIG. 1 shows gate structures, amongst other features, and respective fabrication processes in accordance with aspects of the present disclosure. In particular, the structure 10 is a planar structure which includes substrate 12. In embodiments, the substrate 12 can be a silicon substrate; although other substrate materials are contemplated herein. An oxide material 14 is bonded to the substrate 12. In embodiments, the oxide material 14 can be $SiO_2$; although other insulator materials are also contemplated herein. The oxide material 14 can be a buried oxide (BOX). A semiconductor material 15 is formed on the oxide material 14 to form SOI technology based devices. In embodiments, the semiconductor material 15 is in a fully depleted SOI technology, which can be, e.g., C—SiGe for a PFET device 19 or fully depleted silicon (at least in the channel region) for a NFET device 17.

Shallow trench isolation structures 21 are formed between the PFET device 19 and the NFET device 17. In embodiments, the shallow trench isolation structures 21 are formed by conventional lithography, etching and deposition processes such that no further explanation is required for a complete understanding of the present disclosure. For example, a resist formed over the semiconductor material 15 is exposed to energy (light) to form a pattern (opening). An etching process with a selective chemistry, e.g., reactive ion etching (RIE), is used to form an opening in the semiconductor material 15 through the openings of the resist. The resist is then removed by a conventional oxygen ashing process or other known stripants. An oxide is deposited within the opening, followed by a planarization process, e.g., chemical mechanical planarization (CMP). The deposition of the oxide can be a conventional deposition process, e.g., chemical vapor deposition (CVD) process.

Still referring to FIG. 1, gate structures 16, 18 are formed on the semiconductor material 15. In embodiments, the gate structure 18 is for the PFET device 19 and the gate structure 16 is for the NFET device 17. The gate structures 16, 18 are formed by gate first processes using conventional deposition, lithography and etching processes such that no further explanation is required for a complete understanding of the present disclosure. In embodiments, the gate structures 16, 18 include a gate dielectric material and capping material 16b. The dielectric material can be, e.g., $HfO_2$, $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. The capping layers can be TiN or TaN deposited directly over the gate dielectric to define the final work function of the metal gate stack. A poly material 16c is formed over the gate dielectric and capping material 16b material, with a capping material 16d, e.g., SiN, over the poly material 16c. In embodiments, the capping material 16d, e.g., SiN, will prevent epitaxial material from growing on the gate structures 16, 18.

FIG. 1 further shows a deposition of a bi-layer spacer material 20, 22 over the gate structures 16, 18 and adjacent regions. For example, a first material 20 is deposited on the gate structures 16, 18, followed by a second material 22. In embodiments, the materials 20, 22 are composed of low-k materials, with the top material, e.g., second material 22, being a sacrificial material which can be removed during an epi pre-clean process. In more specific embodiments, the first material 20 is SiN or SiBCN (with B reducing the permittivity of the K value) or SiOCN. The second material 22 can be an oxide material. The materials 20, 22 can be deposited by a conventional deposition process, e.g., atomic layer deposition (ALD) process to a thickness of about 4 nm; although other dimensions are contemplated herein depending on the particular technology nodes and/or design parameters.

Figure 2:
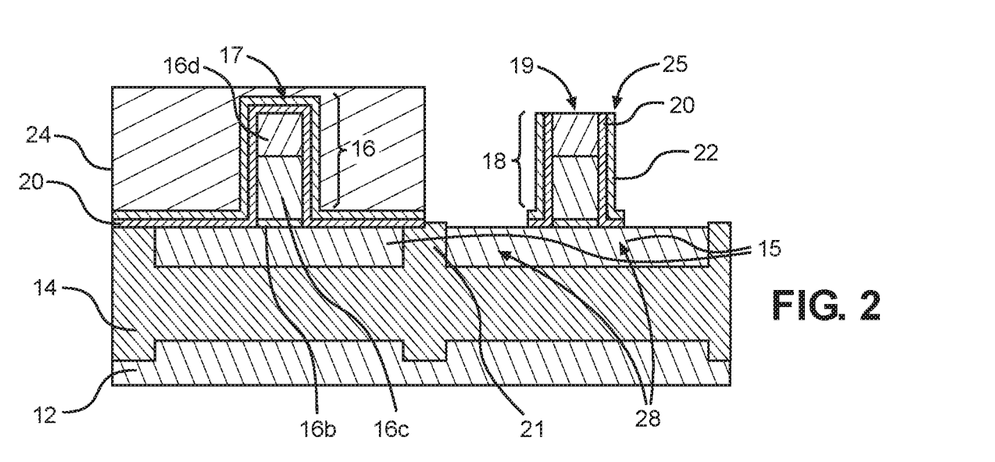
FIG. 2 shows masking material over the gate structures, amongst other features, and respective fabrication processes in accordance with aspects of the present disclosure.

In FIG. 2, a masking material 24 is deposited on the structure and subsequently patterned over the NFET device 17, e.g., NFET region, using conventional lithography and etching processes. In embodiments, the masking material 24 can be any conventional resist stack including, as an example, any material that is selective to the materials 20, 22. The materials 20, 22 which are exposed on the PFET region, e.g., over the PFET device 19, are subjected to an anisotropic etching process to form a bi-layer sidewall spacer 25 on the sidewalls of the gate structure 18 and with a leg extending onto the substrate material 15. In embodiments, the leg can be about 3 nm to about 4 nm in length, based on the thickness of the material 22 that was covering this section of the L-shaped sidewall spacer 26 (shown in FIG. 3). This etching process will expose the underlying substrate material 15 in the source and drain regions 28 of the gate structure 18, in addition to exposing the capping material 16d. It should be understood that this same process can be performed on the NFET device 17 while the PFET device 19 remains protected by the masking material 24.

Figure 3:
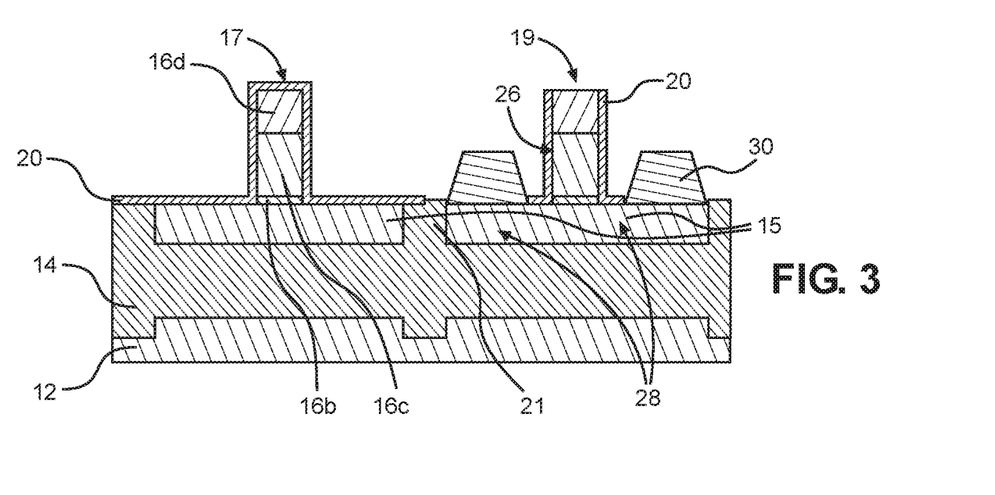
FIG. 3 shows an L-shaped spacer on the gate structure and faceted diffusions, e.g., epitaxial source and drain regions, adjacent to the L-shaped spacer, amongst other features, and respective fabrication processes in accordance with aspects of the present disclosure.

As shown in FIG. 3, the masking material is removed using conventional stripants. Following the removal of the masking material, the second (top) spacer material 22 e.g., sacrificial material, is removed using a selective etching process e.g., preclean process. The removal of the second spacer material 22 will result in an L-shaped sidewall spacer 26 composed of the material 20 on the sidewalls of the gate structure 18 and extending onto the substrate 15 of the PFET device 19. The material 20 will also cover the entirety of the NFET region, e.g., source and drain regions 28 of the NFET device 17. The surface can then be cleaned prior to epitaxial growth using conventional methods such as standard RCA clean (SC1/SC2), HF or SiCoNi.

As further shown in FIG. 3, raised diffusion regions 30, e.g., raised epitaxial source and drain, are grown on the exposed substrate material 15 over the e.g., source and drain regions 28 of the PFET device 19. In embodiments, the L-shaped sidewall spacer 26 will force a consistent faceting of the diffusion regions 30, adjacent to the gate structure 18; that is, with the L-shaped sidewall spacer 26, faceting is consistent and repeatable across the wafer, wafer-to-wafer, lot-to-lot, and across epi-tools. The L-shaped sidewall spacer 26 will also reduce Cov (due to the space provided between raised diffusion regions 30 from the gate structure 18). In embodiments, the epitaxial material can be Si or SiGe material, as examples.

The raised diffusion regions 30 can also include a silicon capping material. Moreover, the capping material 16d and the masking material 20 will prevent epitaxial material from growing on the gate structure 18 and on the NFET region 17 of the structure. In embodiments, these processes can be reversed in order to grow diffusion regions on the gate structure 16 of the NFET device 17. After both NFET and PFET epitaxial raised source drains are complete, capping layer 16d is removed to enable silicide formation on the gate structures.

Prior to contact formation, the raised diffusion regions 30 and the gate structures 16, 18 can undergo a silicide process. As should be understood by those of skill in the art, the silicide process begins with deposition of a thin transition metal layer, e.g., nickel, cobalt or titanium, over fully formed and patterned semiconductor devices (e.g., doped or ion implanted source and drain regions 30 and respective devices 16, 18). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts in the active and gate structure and respective regions of the device (PFET device 19 and NFET device 17).

Although not shown, it should be understood that an insulator material be deposited over the raised diffusion regions 30 of both gate structures 16, 18 (PFET device 19 and NFET device 17). In embodiments, the insulator material can be any interlevel dielectric materials (oxide) material deposited by conventional deposition processes, e.g., chemical vapor deposition (CVD) processes. Contacts can then be formed to the silicided regions using conventional lithography, etching and metal or metal alloy deposition processes such that no further explanation is required herein for a complete understanding of the present disclosure.

Figure 4:
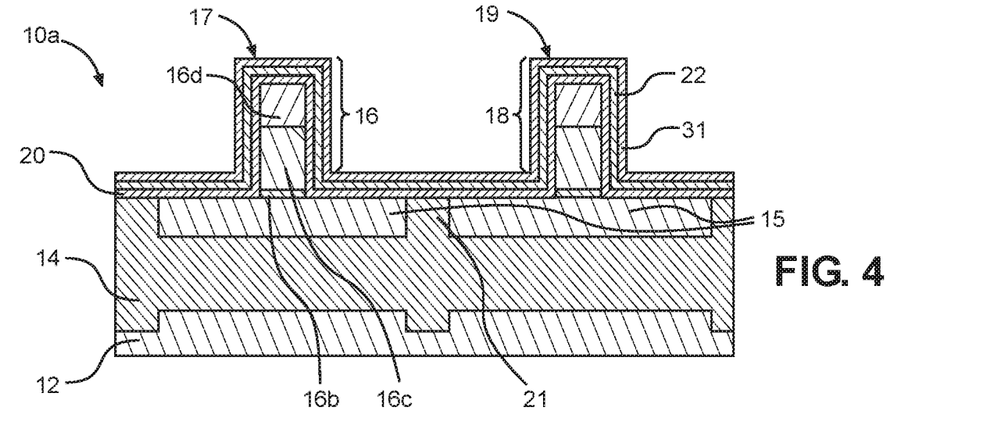
FIGS. 4-6 show an alternative method of manufacturing the L-shaped spacer on a gate structure and epitaxial source and drain region adjacent to the L-shaped spacer, amongst other features, in accordance with aspects of the present disclosure.
Figure 5:
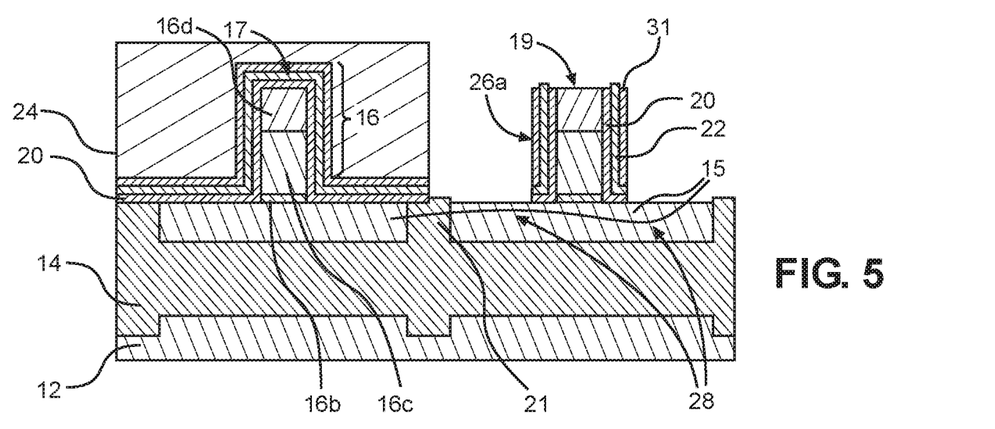
Figure 6:
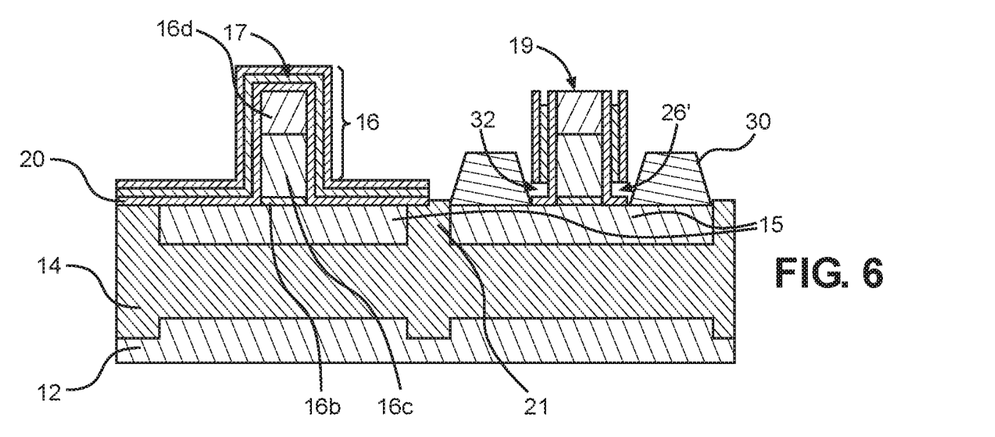

FIGS. 4-6 show an alternative method of manufacturing the L-shaped spacer on a gate structure and epitaxial source and drain region adjacent to the L-shaped spacer, amongst other features, in accordance with aspects of the present disclosure. More specifically, in FIG. 4, the structure 10a includes the deposition of a tri-layer spacer composed of materials 20, 22, 31 over the gate structures 16, 18 and adjacent regions. In more specific embodiments, the first material 20 (e.g., inner layer) and third material (e.g., outer layer 31) can be SiBCN or SiN or SiOCN deposited to a thickness of about 3 nm. The second layer 22 (e.g., middle layer) can be an oxide material deposited to a thickness of about 3 nm. The materials 20, 22, 31 can be deposited by a conventional ALD deposition process. It should be understood that other dimensions are also contemplated herein depending on the particular technology nodes and/or design parameters.

In FIG. 5, the masking material 24 is deposited on the structure and subsequently patterned over the NFET device 17, e.g., NFET region, using conventional lithography and etching processes. In embodiments, the masking material 24 can be any conventional resist stack including any material that is selective to the materials 20, 22, 31. The materials 20, 22, 31 exposed on the PFET region, e.g., over the PFET device 19, are subjected to an anisotropic etching process to form a tri-layer sidewall spacer 26a on the sidewalls of the gate structure 18 and with a leg extending onto the substrate material 15. In embodiments, the leg can be about 3 nm to about 4 nm in length, based on the thickness of the material 22 that was covering this section of the L-shaped sidewall spacer 26. This etching process will expose the underlying substrate material 15 in the source and drain regions 28 of the gate structure 18, in addition to exposing the capping material 16d. It should be understood that this same process can be performed on the NFET device 17 while the PFET device 19 remains protected by the masking material 24.

As shown in FIG. 6, the masking material 24 is removed using conventional stripants. Following the removal of the masking material, the exposed portion of the second spacer material 22, e.g., sacrificial material, is removed using a selective etching process e.g., preclean process. More specifically, the exposed portion of the second spacer material 22 (e.g., oxide material) is recessed with an epi pre-clean process such as, i.e., HF and SiCoNi. The recess 32 of the second spacer material 22 will result in an L-shaped sidewall spacer 26' composed of the material 20 on the sidewalls of the gate structure 18 of the PFET device 19. The material 22, 31 can also remain partially on the sidewalls of the gate structure 18. In this way, an L-shaped sidewall spacer 26 with outer material 22, 31 can be formed. The retained outer layers 22, 31 will reduce capacitance and act as additional protection from contact-to-gate shorting. The material 20, 22 and 31 will also cover the entirety of the NFET region, e.g., source and drain regions 28 of the NFET device 17. The surface can then be cleaned using conventional methods as already described herein.

As further shown in FIG. 6, raised diffusion regions 30, e.g., raised epitaxial source and drain, are grown on the exposed substrate material 15 on the e.g., source and drain regions 28 of the PFET device 19. In embodiments, the L-shaped sidewall spacer 26' will force a consistent faceting of the diffusion regions 30, adjacent to the gate structure 18; that is, with the L-shaped sidewall spacer 26', faceting is consistent repeatable across wafer, wafer-to-wafer, lot-to-lot, and across epi-tools. The L-shaped sidewall spacer 26' will also reduce Cov (due to the space provided between raised diffusion regions 30 from the gate structure 18). In embodiments, the epitaxial material can be Si or SiGe material, as examples.

The raised diffusion regions 30 can also include a silicon capping material. Moreover, the capping material 16d and the masking material 20 will prevent epitaxial material from growing on the gate structure 18 and on the NFET region 17 of the structure. In embodiments, these processes can be reversed in order to grow diffusion regions on the gate structure 16 of the NFET device 17.

Prior to contact formation, the raised diffusion regions 30 and gate structures 16, 18 can undergo a silicide process. As should be understood by those of skill in the art, the silicide process begins with deposition of a thin transition metal layer, e.g., nickel, cobalt or titanium, over fully formed and patterned semiconductor devices (e.g., doped or ion implanted source and drain regions 30 and respective devices 16, 18). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts in the active regions of the device (PFET device 19 and NFET device 17).

Although not shown, it should be understood that an insulator material be deposited over the raised diffusion regions 30 of both gate structures 16, 18 (PFET device 19 and NFET device 17). In embodiments, the insulator material can be any interlevel dielectric materials (oxide) material deposited by conventional deposition processes, e.g., chemical vapor deposition (CVD) processes. Contacts can then be formed to the silicided regions using conventional lithography, etching and metal or metal alloy deposition processes such that no further explanation is required herein for a complete understanding of the present disclosure.

Figure 7:
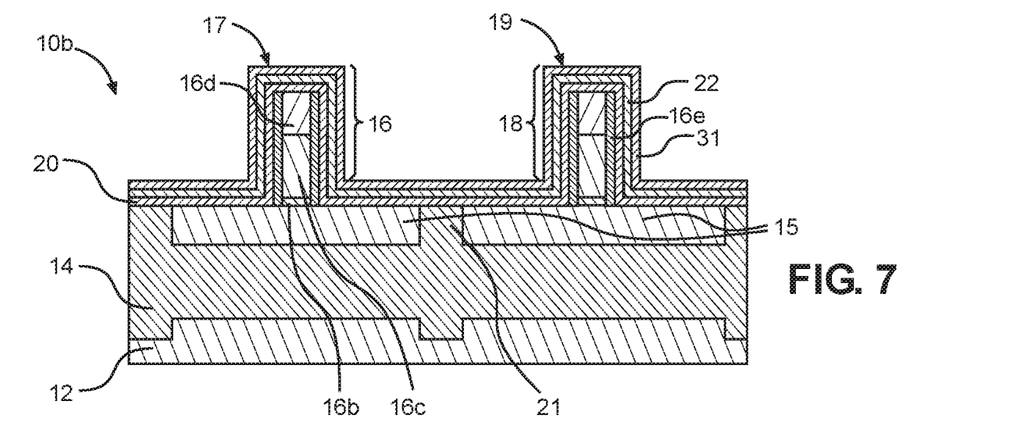
FIGS. 7-10 show another alternative method of manufacturing the L-shaped spacer on a gate structure and epitaxial source and drain region adjacent to the L-shaped spacer, amongst other features, in accordance with aspects of the present disclosure.

FIGS. 7-10 show another alternative method of manufacturing the L-shaped spacer on a gate structure and epitaxial source and drain region adjacent to the L-shaped spacer, amongst other features, in accordance with aspects of the present disclosure. In FIG. 7, the structure 10b is similar to the structure 10a described in FIG. 4, with the addition of a sidewall spacer 16e on a sidewall of the gate structures 16, 18. In embodiments, the sidewall spacer 16e is SiBCN or SiN or SiOCN deposited to a thickness of about 3 nm. As should be understood by those of skill in the art, the sidewall spacer 16e can be fabricated by the deposition of material over the gate structures 16, 18, followed by an anisotropic etching process. In addition, the first material 20 is oxide, (e.g., inner layer), the second material 22 is nitride and the third material (e.g., outer layer 31) is oxide.

Figure 8:
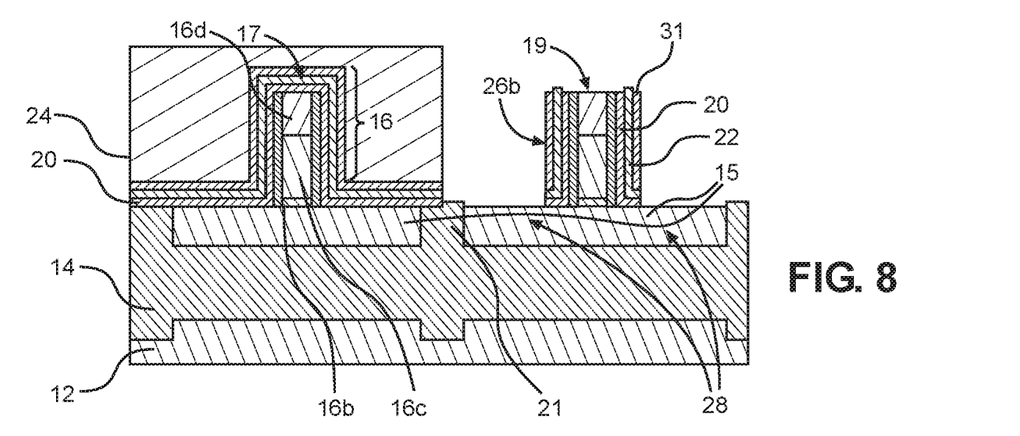

As shown in FIG. 8, the masking material 24 is deposited on the structure and subsequently patterned over the NFET device 17, e.g., NFET region, using conventional lithography and etching processes as described already with respect to FIG. 5. In embodiments, the masking material 24 can be any conventional resist stack including any material that is selective to the materials 16e, 20, 22, 31. The materials 20, 22, 31 exposed on the PFET region, e.g., over the PFET device 19, are subjected to an anisotropic etching process to form a four layer sidewall spacer 26b (e.g., materials 16e, 20, 22 and 31) on the sidewalls of the gate structure of the PFET device 19. This etching process will expose the underlying substrate material 15 in the source and drain regions 28 of the gate structure 18, in addition to exposing the capping material 16d of the gate structure 18. It should be understood that this same process can be performed on the NFET device 17 while the PFET device 19 remains protected by the masking material 24.

Figure 9:
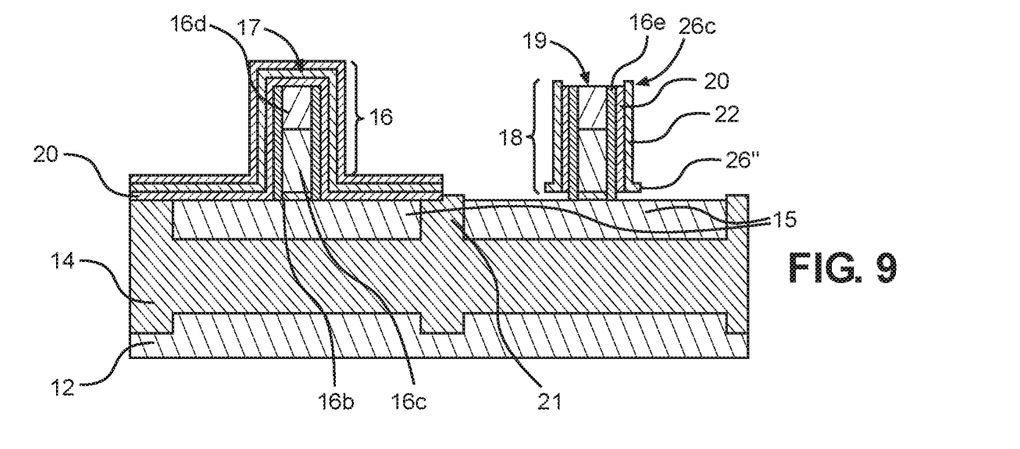

As shown in FIG. 9, the masking material 24 is removed using conventional stripants. Following the removal of the masking material, the spacer material 31, e.g., sacrificial material, and exposed portions of the underlying spacer material 20 are removed using a selective etching process e.g., preclean process. More specifically, the removal of the exposed portion of the spacer material 20 and spacer material 31 (e.g., oxide materials) can be provided by an epi pre-clean process such as, i.e., HF and SiCoNi. This will form an L-shape spacer 26c (shown also in FIG. 10) on the sidewalls of the gate structure 18 of the PFET device 19, composed of the material 22. A leg 26" of the L-shaped spacer 26c can be about 3 nm to about 4 nm in length, based on the thickness of the material 31 that was covering this section of the L-shaped sidewall spacer 26c. A recessed portion 32a is provided below the leg 26" (e.g., between the leg 26" and the substrate material 15).

The retained layers 16e, 20 and 22 will reduce capacitance and act as additional protection from contact-to-gate shorting. The material 20, 22 and 31 will also cover the entirety of the NFET region, e.g., source and drain regions 28 of the NFET device 17. The surface can then be cleaned using conventional methods as already described herein.

Figure 10:
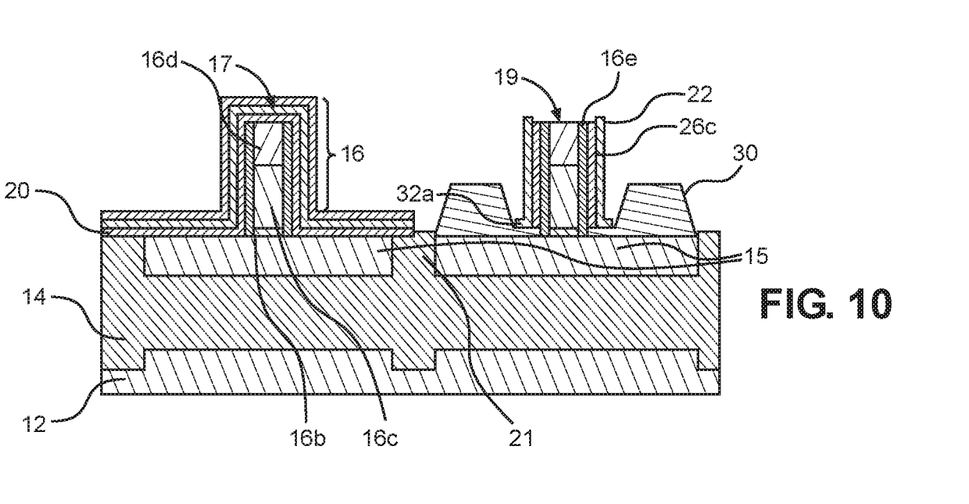

As further shown in FIG. 10, raised diffusion regions 30, e.g., raised epitaxial source and drain, are grown on the exposed substrate material 15 on the e.g., source and drain regions of the PFET device 19. In embodiments, the raised diffusion regions 30 will also be formed within the recessed portion 32a. As in the other embodiments, the L-shaped sidewall spacer 26c will force a consistent faceting of the diffusion regions 30, adjacent to the gate structure 18; that is, with the L-shaped sidewall spacer 26c, faceting is consistent repeatable across wafer, wafer-to-wafer, lot-to-lot, and across epi-tools. The L-shaped sidewall spacer 26c will also reduce Cov (due to the space provided between raised diffusion regions 30 from the gate structure 18). In embodiments, the epitaxial material can be Si or SiGe material, as examples.

The raised diffusion regions 30 can also include a silicon capping material. Moreover, the capping material 16d and the masking material 20, 22 will prevent epitaxial material from growing on the gate structure 18 and on the NFET region 17 of the structure. In embodiments, these processes can be reversed in order to grow diffusion regions on the gate structure 16 of the NFET device 17.

Prior to contact formation, the raised diffusion regions 30 and gate structures 16, 18 can undergo a silicide process as already described herein. Also, although not shown, it should be understood that an insulator material be deposited over the raised diffusion regions 30 of both gate structures 16, 18 (PFET device 19 and NFET device 17) and contacts are formed to the silicided regions using conventional lithography, etching and metal or metal alloy deposition processes such that no further explanation is required herein for a complete understanding of the present disclosure. The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
   a gate structure located on a substrate;
   an L-shaped sidewall spacer directly contacting sidewalls of the gate structure and extending over the substrate adjacent to the gate structure; and
   faceted diffusion regions on a top surface of the substrate, adjacent to the L-shaped sidewall spacer, wherein
   the L-shaped sidewall spacer is composed of a tri-layer of material, and
   wherein the tri-layer of material includes a recessed middle layer of material and an outer layer of sidewall material directly on the recessed middle layer, wherein the recessed middle layer is recessed on an upper portion thereof and is recessed with respect to the outer layer and the L-shaped sidewall spacer, and both the recessed middle layer and the outer layer are above and not in contact with a leg extending outwardly from a vertical section of the L-shaped sidewall spacer.

2. The structure of claim 1, wherein the L-shaped sidewall spacer is composed of a low-k material directly contacting a top surface of diffusion regions in the substrate and extending onto sidewalls and a top portion of an adjacent gate structure.

3. The structure of claim 2, wherein the L-shaped sidewall spacer is composed of a nitride material.

4. The structure of claim 3, wherein the L-shaped sidewall spacer is composed of SiN or SiBCN.

5. The structure of claim 1, wherein the recessed middle layer of material is different than an inner layer and the outer layer of sidewall material of the tri-layer of material, and the faceted diffusion regions do not contact the outer layer of sidewall material.

6. The structure of claim 5, wherein the inner layer and the outer layer of the tri-layer of material is composed of a low-k spacer including a combination of SiBCN, SiN or SiOCN and the recessed middle layer of material is an oxide material.

7. The structure of claim 1, wherein the faceted diffusion regions are epitaxial grown source and drain regions directly on the surface of the substrate, and which contacts a leg portion of the L-shaped sidewall spacer and is remote from a vertical section of the L-shaped sidewall spacer.

8. The structure of claim 1, wherein the substrate is fully depleted Si material.

9. The structure of claim 1, wherein the substrate is SiGe material and the gate structure is a PFET device.

10. A structure comprising:
a semiconductor on insulator substrate;
a gate structure formed on the semiconductor on insulator substrate;
an L-shaped sidewall spacer on a sidewall of the gate structure and extending above and remote from the semiconductor on insulator substrate; and
faceted raised epitaxial grown source and drain regions adjacent to and underneath a leg of the L-shaped sidewall spacer extending onto a surface of the semiconductor on insulator substrate,
wherein the L-shaped sidewall spacer is composed of a tri-layer of material comprising a middle layer of material directly underneath the L-shaped sidewall spacer and also extending above and remote from a surface of the semiconductor on insulator substrate, an inner layer of sidewall material directly underneath the middle layer of material and contacting the gate structure, the inner layer of sidewall material extends to and is in contact with the semiconductor on insulator substrate, and the faceted raised epitaxial grown source and drain regions are underneath the middle layer of material and the L-shaped sidewall spacer.

11. The structure of claim 10, wherein the faceted diffusion regions are raised epitaxial source and drain regions.

12. The structure of claim 10, wherein the L-shaped sidewall spacer is composed of a low-k spacer including SiBCN or SiN or SiOCN.

13. The structure of claim 10, wherein an inner layer and the outer layer of the tri-layer of material are composed of a combination of SiBCN, SiN or SiOCN and the recessed middle layer of material is an oxide material.

14. The structure of claim 10, wherein the semiconductor on insulator substrate is fully depleted Si material.

15. The structure of claim 10, wherein the semiconductor on insulator substrate is SiGe material and the gate structure is a PFET device.

16. A method comprising:
forming a gate structure on a substrate;
forming at least a bi-layer spacer stack composed of a sacrificial layer of material;
etching the bi-layer spacer stack to form two L-shaped spacers comprising an L-shaped sidewall spacer directly on a sidewall of the gate structure and a L-shaped spacer composed of the sacrificial layer of material and which is directly on the L-shaped sidewall spacer;
removing at least a portion of the L-shaped spacer composed of the sacrificial layer, leaving the L-shaped sidewall spacer directly on the sidewall of the gate structure; and
forming a raised source/drain region on a surface of diffusion regions of the substrate adjacent to the first L-shaped sidewall spacer.

17. The method of claim 16, wherein the bi-layer spacer stack is a tri-layer stack of material and the removing step includes a recess of a middle layer of the tri-layer stack of material to form the L-shaped sidewall spacer with three layers of material on a sidewall of the gate structure.

* * * * *